US009244108B2

(12) United States Patent
Hausberger et al.

(10) Patent No.: US 9,244,108 B2
(45) Date of Patent: Jan. 26, 2016

(54) DEVICE FOR DETECTING THE INSULATION RESISTANCE OF A HIGH VOLTAGE BATTERY SYSTEM

(75) Inventors: Ingo Hausberger, Graz (AT); Andreas Kober, Markt Hartmannsdorf (AT); Markus Lettner, Wettmannstätten (AT); Renato Mandic, Graz (AT)

(73) Assignee: Samsung SDI Co., Ltd., Yongin-si (KR)

( * ) Notice: Subject to any disclaimer, the term of this patent is extended or adjusted under 35 U.S.C. 154(b) by 91 days.

(21) Appl. No.: 13/620,756

(22) Filed: Sep. 15, 2012

(65) Prior Publication Data

US 2013/0314097 A1    Nov. 28, 2013

Related U.S. Application Data

(60) Provisional application No. 61/535,611, filed on Sep. 16, 2011.

(30) Foreign Application Priority Data

Feb. 21, 2012   (EP) ..................................... 12156318

(51) Int. Cl.
*G01R 31/00* (2006.01)
*B60L 3/00* (2006.01)
(Continued)

(52) U.S. Cl.
CPC .............. *G01R 31/006* (2013.01); *B60L 3/0046* (2013.01); *B60L 3/0069* (2013.01);
(Continued)

(58) Field of Classification Search
USPC ............ 324/503, 764.01, 500, 509, 512, 522, 324/523, 525, 537, 538, 539, 543, 544, 541, 324/551
See application file for complete search history.

(56) References Cited

U.S. PATENT DOCUMENTS 6,731,116 B2 *   5/2004   Yamamoto et al. ........... 324/522
2003/0042909 A1   3/2003   Yamamoto et al.
(Continued)

FOREIGN PATENT DOCUMENTS

| EP | 1265076 A1 | 12/2002 |
|---|---|---|
| EP | 1289094 A1 | 3/2003 |

(Continued)

OTHER PUBLICATIONS

Chen Chen, Chinese Application No. 201210344860.8 Search Report, Jun. 25, 2014, pp. 4-5, Jiangsu Patent Examination Cooperation Center, China.
(Continued)

*Primary Examiner* — Patrick Assouad
*Assistant Examiner* — Demetrius Pretlow
(74) *Attorney, Agent, or Firm* — Christie, Parker & Hale, LLP

(57) ABSTRACT

A device for detecting the insulation resistance of a high-voltage battery system of a motor vehicle that includes a high-voltage battery and a high-voltage component which is operatively connected to terminals of the high-voltage battery via converters. The device includes a reference resistor operatively connected to the terminals of the high-voltage battery via switches, with a voltage measurement device configured to detect the voltage present between each respective terminal and a reference potential of the vehicle; a voltage measurement device configured to measure the voltage between the terminals; and a coupling circuit configured to monitor the high-voltage component when the contactors are open.

17 Claims, 4 Drawing Sheets

(51) Int. Cl.
  *G01R 27/02* (2006.01)
  *G01R 31/02* (2006.01)
  *B60L 11/18* (2006.01)

(52) U.S. Cl.
  CPC ........... *B60L11/1803* (2013.01); *G01R 27/025* (2013.01); *G01R 31/02* (2013.01); *G01R 31/025* (2013.01); *Y02T 10/7005* (2013.01)

(56) References Cited

U.S. PATENT DOCUMENTS

| | | | | |
|---|---|---|---|---|
| 2004/0189330 | A1* | 9/2004 | Herb et al. | 324/691 |
| 2007/0285057 | A1* | 12/2007 | Yano | 320/116 |
| 2007/0285102 | A1 | 12/2007 | Muller | |
| 2009/0134881 | A1* | 5/2009 | Tachizaki | 324/551 |
| 2009/0251103 | A1* | 10/2009 | Yamamoto et al. | 320/133 |
| 2010/0171511 | A1* | 7/2010 | Horikoshi et al. | 324/551 |
| 2010/0237872 | A1* | 9/2010 | Kang et al. | 324/429 |
| 2011/0006777 | A1* | 1/2011 | Park et al. | 324/509 |
| 2011/0084705 | A1* | 4/2011 | Kawamura | 324/551 |
| 2011/0140714 | A1* | 6/2011 | Hernando et al. | 324/551 |

FOREIGN PATENT DOCUMENTS

| | | |
|---|---|---|
| EP | 1857825 A1 | 11/2007 |
| JP | 2003169401 A | 6/2003 |
| JP | 2003324801 A | 11/2003 |
| JP | 2009268214 A | 11/2009 |

OTHER PUBLICATIONS

SIPO Office action dated Sep. 8, 2015, with English translation, corresponding to Chinese Patent application 201210344860.8, (10 pages).

* cited by examiner

DEVICE FOR DETECTING THE INSULATION RESISTANCE OF A HIGH VOLTAGE BATTERY SYSTEM

CROSS-REFERENCE TO RELATED APPLICATIONS

The present application claims priority under 35 U.S.C. §119 to European Patent Application No. 12156318.3 (filed on Feb. 21, 2012), which claims priority to U.S. Provisional Patent Application No. 61/535,611 (filed on Sep. 16, 2011), which are each hereby incorporated by reference in their respective entireties.

FIELD OF THE INVENTION

The invention relates to a device for detecting the insulation resistance of a high-voltage battery system, preferably of a motor vehicle.

BACKGROUND OF THE INVENTION

High-voltage systems of electrically assisted or fully electrically driven vehicles require monitoring in terms of their insulation level. The voltages on the battery side have a level of up to several 100 volts, namely the HV range (high-voltage range). The batteries in the HV range are coupled to a high-voltage component in the form of current distribution via HV contactors. The current distribution acts on the converters, for example, for the drive machines in the drive or generator mode. In turn, in the high-voltage range the converters apply alternating current (three phases) to the corresponding machines.

In addition, the on-board power supply system designed for the low-voltage range (12V, 24V) is also supplied via a DC-to-DC converter. The high-voltage electrics and the low-voltage electrics are in this case DC-isolated from one another. All of the lines in the HV range (i.e., both the positive and the negative line on the DC side) are insulated with respect to the vehicle earth, the bodywork.

The insulation and line configuration is such that an insulation fault in a line or a terminal does not directly result in any risk, i.e., in a hazardous touch voltage between the housing and earth. Such a first insulation fault does not bring about a short circuit of the battery terminals either. This is only the case when the second line also has an insulation fault. In order to locate such insulation faults as early as possible, insulation detection systems are provided which, as an on-board device, constantly check the insulation state and indicate it to the driver or initiate safety measures.

DD 279 958 A1 describes, in the case of an electrically driven vehicle, a circuit arrangement for monitoring the insulation state of a fraction circuit with respect to other vehicle parts. What is provided is an AC voltage generator which is adjacent to the vehicle earth on one side and has an internal resistance which is matched to the minimum permissible insulation resistance. The AC voltage generator is connected to the traction circuit to be monitored via capacitor circuits. The output is connected to a threshold value switch. The threshold value switch responds to an undershoot of the AC voltage.

DE 43 39 946 A1 describes a method for insulation monitoring of unearthed DC systems. Alternately, different pulse voltage values are applied as measurement voltage via resistive system coupling. The measurement current produced in the settled state is detected. In order to determine the ohmic insulation resistance, differences between successive measurement current values are used.

A circuit arrangement for determining the insulation resistance of a rechargeable battery is described in DE 196 1897 B4. The no-load voltage and the load voltage is measured, for which purpose two capacitors are connected in series between the battery terminals. The common point of the capacitors is connected to earth via a bleeder resistor. Measurement amplifiers are connected by switching means for predetermined times for measuring the partial voltages set across the capacitors.

A circuit arrangement for insulation and contactor monitoring of the power supply of an electric drive is disclosed in DE 10 2006 050 529 A1. High-voltage battery and power electronics are connected to one another via contactors. A voltage source connected to the vehicle earth produces a measurement voltage. Two voltmeters measure the voltage steps produced by the measurement voltage with respect to the vehicle earth. The voltage source couples the measurement voltage onto the line via measuring resistors in such a way that at least one contactor is connected between the feed point and the measurement point.

In order to check the contact between a high-voltage battery and the lines of a high-voltage system, DE 10 2008 012 418 A1 proposes a capacitor which is arranged in parallel with the load and which is charged via a precharging resistor and is discharged to a prescribed relatively low voltage value in the state in which it is disconnected from the battery. The capacitor used can be that of the intermediate circuit of an inverter. The absence of a charge current across the charging resistor is assessed as being an improper connection of the battery to the high-voltage system.

SUMMARY OF THE INVENTION

In accordance with embodiments of the invention, a device is provided and configured to detect the insulation resistance of a high-voltage battery system of the described type with an improved embodiment, in particular with the aim of reducing component complexity.

In accordance with embodiments of the invention, a device is provided and configured to detect the insulation resistance of a high-voltage battery system, preferably of a motor vehicle, the HV battery system comprising a high-voltage battery (HV Bat) and a high-voltage component (HV Comp), which is operatively connected to the battery terminals via switchable contactors (S Main+, S Main−), for example, in the form of a converter. The device for detection the insulation resistance includes at least one of the following: a reference resistor (R0), which can be connected optionally to the terminals of the high-voltage battery (HV Bat) via switches (S Iso+, S Iso−, S Aux), with a voltage measurement device configured to detect the voltage present between the respective terminal and the reference potential of the vehicle (bodywork); a voltage measurement device configured to measure the high voltage between the terminals; and a coupling circuit (R Cpl) configured to monitor the external high-voltage component when the contactors (S Main+, S Main−) are open.

In accordance with embodiments of the invention, a device for detecting the insulation resistance of a high-voltage battery system comprising a high-voltage battery; a high-voltage component, such as, for example, a converter, which is operatively connected to the battery terminals via switchable contactors. The device for detecting the insulation resistance includes at least one of the following: a reference resistor, which can be connected optionally to the terminals of the high-voltage battery via switches, with a voltage measurement device configured to detect the voltage present between the respective terminal and the reference potential of the vehicle (bodywork); a voltage measurement device configured to measure the high voltage between the terminals; and a coupling circuit configured to monitor the external high-voltage component when the contactors are open.

In accordance with embodiments of the invention, a device is provided for detecting the insulation resistance of a battery system that includes a battery and a component which is operatively connected to terminals of the battery via switchable contactors. The device includes at least one of the following: a reference resistor operatively connected to the terminals of the battery via switches, with a voltage measurement device configured to detect the voltage present between each respective terminal and a reference potential; a voltage measurement device configured to measure the voltage between the terminals; and a coupling circuit configured to monitor the component when the switchable contactors are open.

In accordance with embodiments of the invention, a device is provided for detecting the insulation resistance of a high voltage battery system of a motor vehicle, the high voltage battery system including a high voltage battery and a high voltage component which is operatively connected to terminals of the high voltage battery via switchable contactors. The device includes at least one of the following: a reference resistor operatively connected to the terminals of the high-voltage battery, with a voltage measurement device configured to detect the voltage present between each respective terminal and a reference potential of the motor vehicle; a voltage measurement device configured to measure the voltage between the terminals; and a coupling circuit configured to monitor the component when the switchable contactors are open.

A controller is provided which is operatively connected to the switches and the voltage measurement device for detecting the voltage values present between the respective terminal and the reference potential of the vehicle (bodywork) and by way of which the voltage values can be detected depending on the switch states. The contactors can be operatively connected to the controller, with the result that the voltage values can be detected depending on the switching states of the contactors.

In order to determine the insulation resistance, the reference resistor is alternately connected in parallel with the insulation resistances. The voltages between the terminals and the reference potential are measured once the parasitic capacitances have been transferred. Once the reference resistor switches to both terminals of the high-voltage battery, the insulation resistance can be calculated. Then, depending on the switching states of the switches, contactors, this corresponds to a resistance value of a parallel circuit of the insulation resistances of the battery system alone or to a resistance value of a parallel circuit of the insulation resistances of the battery and those of the high-voltage component.

In accordance with embodiments of the invention, the device for detecting the insulation resistance manages without any additional test source. The energy store, the high-voltage battery, is used as test source.

BRIEF DESCRIPTION OF THE DRAWINGS

Advantageous refinements of the invention will emerge from the dependent claims. An exemplary embodiment of the invention will be discussed in principle below on the basis of the drawing, in which:

DETAILED DESCRIPTION OF EMBODIMENTS

The two terminals P+, P− of a high-voltage battery HV Bat of a motor vehicle (not illustrated) are operatively connected to a high-voltage component HV Comp via switchable contactors S Main+, S Main−. Each battery terminal P+, P− has an insulation resistance R IsoInt+, R IsoInt− with respect to the reference potential, the vehicle bodywork. Likewise, each of the terminals has a parasitic capacitance C Yint+, C Yint−. A reference resistor R0 can be operatively connected optionally to the positive or negative terminal P+, P− of the high-voltage battery via controllable switches S Iso+, S Iso−. The switches S Iso+, S Iso− are in the form of transistors (MOSFETs) and can thus be switched from a controller. The respectively applied voltage U Iso+, U Iso− is measured via a voltage measurement device between the respective terminal P+, P− and the reference potential of the vehicle. The voltage U Bat present at the battery terminals P+, P− is measured directly using a further voltage measurement device.

Figure 1:
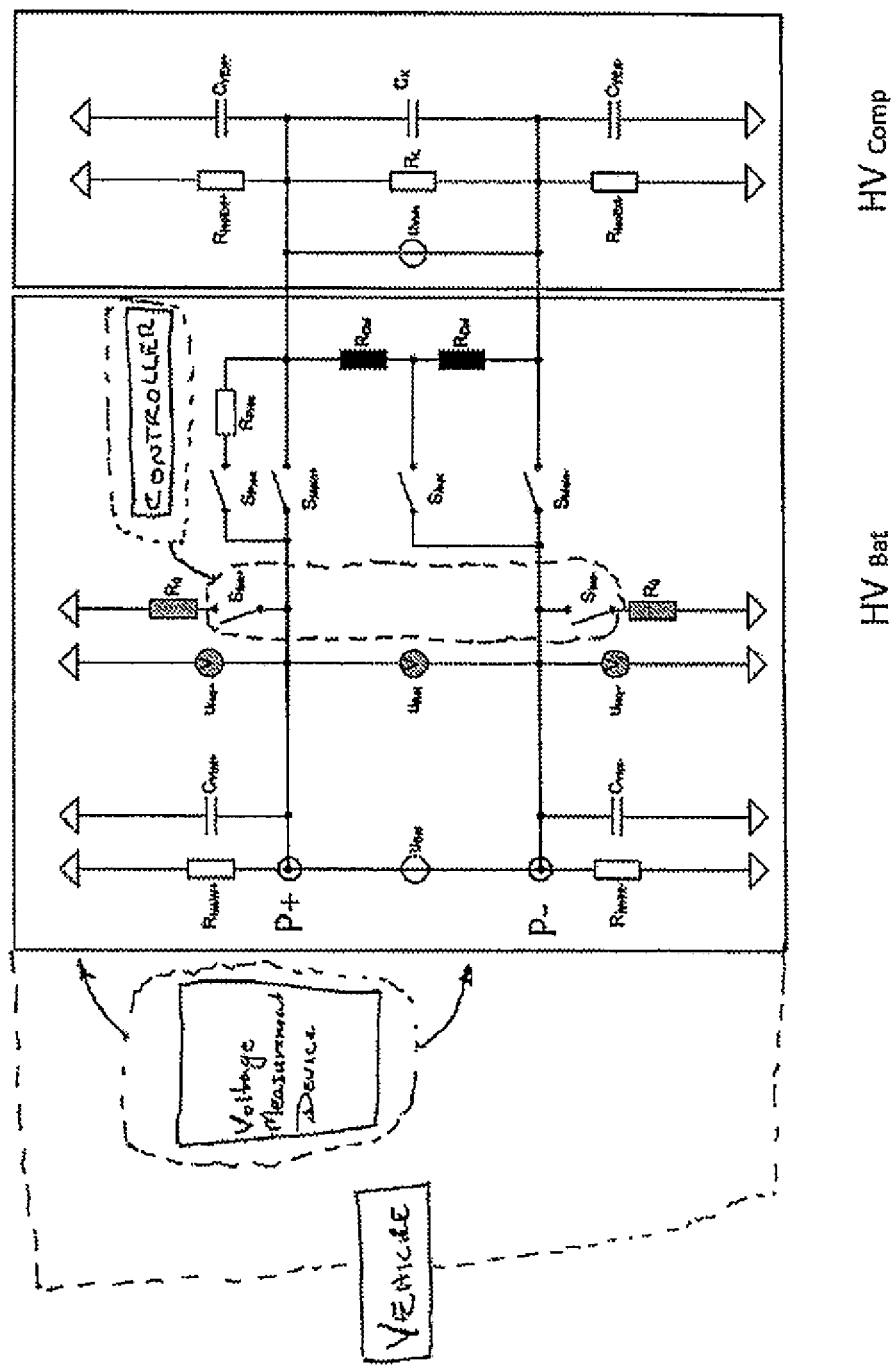
FIGS. 1 and 2 illustrate a basic circuit diagram of a high-voltage battery which is connected at its terminals to a high-voltage component via contactors.

FIG. 1 illustrates a first embodiment of a coupling circuit. The center point of the coupling circuit formed from two resistors R Cpl can be operatively connected directly to one of the battery terminals, the negative terminal P− in the case illustrated, via a switch S Aux in the form of a relay. The switch S Aux is particulary a galvanical switch. A charging resistor R Prec for charging the high-voltage battery HV Bat can be connected in parallel with the contactor S Main+ via a switch S Prec, said contactor S Main+ connecting the positive terminal P+ to the high-voltage component HV Comp.

Figure 2:
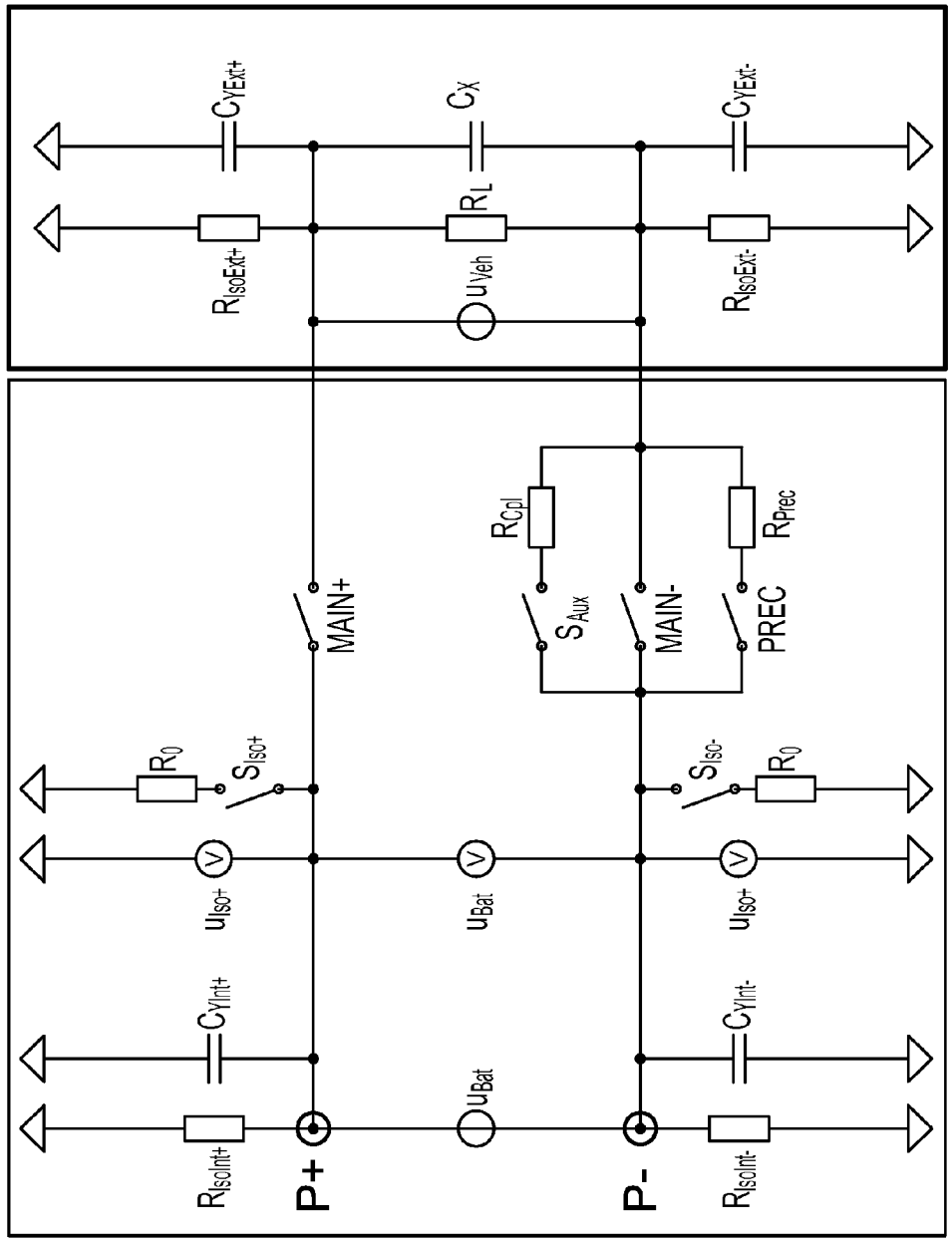

FIG. 2 illustrates a further embodiment of the coupling circuit. The coupling circuit is formed from one resistor R Cpl and the switch S Aux. Via this switch S Aux, also particullary a galvanical switch (relay), the resistor R Cpl can be operatively connected directly to the negative terminal P−. The coupling with the positive terminal P+ occurs via the resistance R L and/or the capacitance C X.

Figure 3:
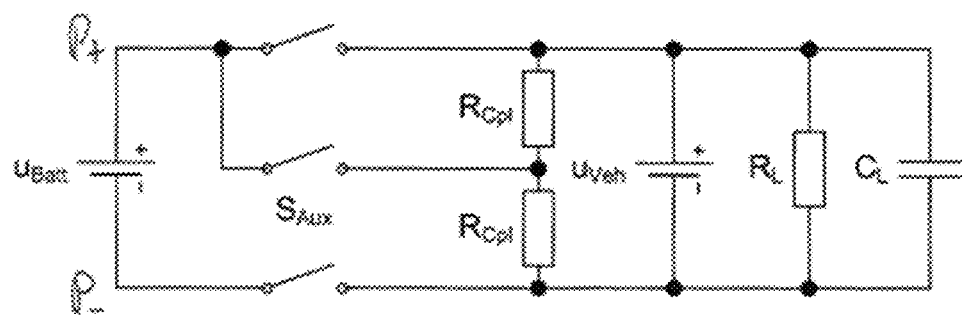
FIGS. 3 through 6 illustrate further embodiments of the basic components of coupling circuits.

As illustrated in FIG. 3, the centre point of the coupling circuit formed from two resistors R Cpl can be operatively connected directly to the positive terminal P+ in the case illustrated, via a switch S Aux in the form of a relay. This comes up to the coupling circuit illustrated in FIG. 1, the polarity is contrary.

Figure 4:
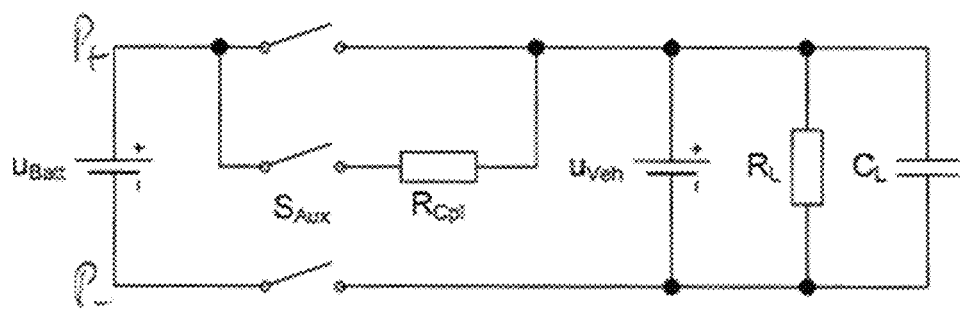

As illustrated in FIG. 4, the coupling circuit is formed from one resistor R Cpl and the switch S Aux. Via this switch S Aux, also particullary a galvanical switch (relay), the resistor R Cpl can be operatively connected directly to the positive terminal P+. This comes up to the coupling circuit illustrated in FIG. 2, except for the polarity of the terminal.

Figure 5:
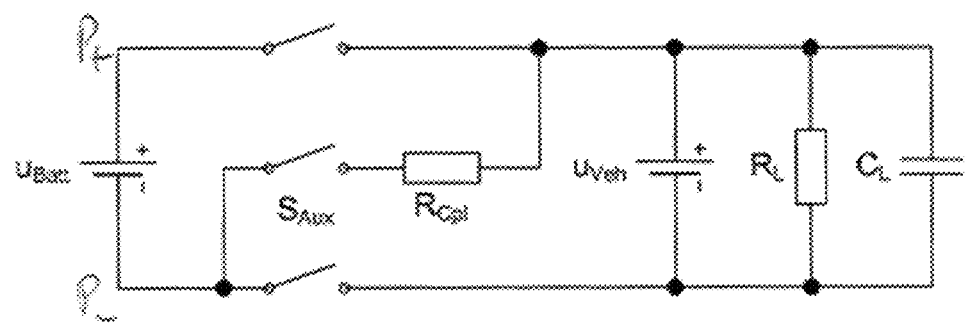
Figure 6:
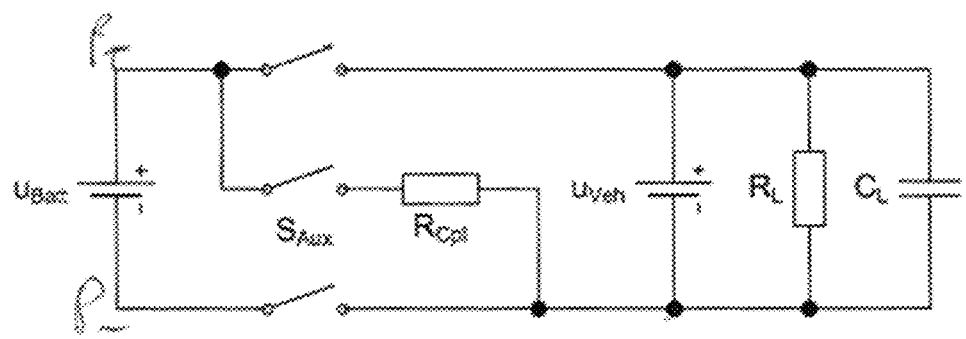

FIGS. 5 and 6 illustrate embodiments in which the coupling circuit is respectively formed from one resistor R Cpl and the switch S Aux. Via this switch S Aux the resistor R Cpl can be operatively connected between the negative terminal P− and the positive terminal P+.

The charging circuit is formed from the charging resistor R Prec and the switch charging battery S Prec. In the embodiment illustrated in FIG. 1, the charging circuit is arranged in the positive terminal P+. In the embodiment illustrated in FIG. 2, the charging circuit is arranged in the negative terminal P−. The resistance value of R Cpl exceeds the resistance value of R Prec− current limiting.

Similarly to the situation of the high-voltage battery HV Bat, the high-voltage component HV Comp has an insulation resistance R Isoext+, R Isoext−. Likewise, each of the terminals of the high-voltage component HV Comp has a parasitic capacitance C YExt+, C YExt−. The voltage present at the input of the high-voltage component HV Comp is specified by U Veh. The resistive load of the high-voltage component HV Comp is R L, and the capacitance is C X.

In order to determine the insulation resistance, the known reference resistor R0 is connected alternately in parallel with the insulation resistance R IsoInt+, R IsoInt−. In addition, the voltages are measured between the terminals P+, P− and the reference potential U Iso+, U Iso− once the parasitic capacitances C Yint+, C Yint−, C YExt+, C YExt− have been recharged. Once the reference resistor R0 has been switched onto the two terminals P+, P−, the insulation resistance can be calculated.

The following results for the resistance R Iso depending on the switching states of the switches, contactors S Main+, S Main−, S Prec and S Aux:

S Main+, S Main−, S Aux or S Prec closed:
R Iso corresponds to the parallel circuit of R IntIso+, R IntIso−, R ExtIso+ and R ExtIso−
S Main+, S Main−, S Prec and S Aux open:
R Iso corresponds to the parallel circuit of R IntIso+, R IntIso−.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

LIST OF REFERENCE SYMBOLS

R IsoInt+ Insulation resistance internal (high-voltage battery) positive terminal
R IsoInt− Insulation resistance internal (high-voltage battery) negative terminal
R IsoExt+ Insulation resistance external (high-voltage component) positive terminal
R IsoExt− Insulation resistance external (high-voltage component) negative terminal
R L Resistance load (high-voltage component)
R Prec Charging resistor
R0 Reference resistor
R Cpl Coupling circuit, coupling resistor
C YInt+ Capacitance internal (high-voltage battery) positive terminal
C YInt− Capacitance internal (high-voltage battery) negative terminal
C YExt+ Capacitance external (high-voltage component) positive terminal
C YExt− Capacitance external (high-voltage component) negative terminal
C X Capacitance high-voltage component
U Iso+ Measurement voltage positive terminal (battery)—reference potential
U Iso− Measurement voltage negative terminal (battery)—reference potential
U Bat Battery voltage
S Iso+Switch—reference resistor R0 with respect to positive terminal P+
S Iso− Switch—reference resistor R0 with respect to negative terminal P−
S Aux Switch, relay—action on the coupling circuit
S Main+ Contactor positive terminal battery
S Main− Contactor negative terminal battery
S Prec Switch charging battery—series resistor R Prec
HV Bat High-voltage battery
HV Comp High-voltage component (converter)

What is claimed is:

1. A device for detecting insulation resistance of a high-voltage battery system of a motor vehicle that includes a high-voltage battery, the device comprising:
a high-voltage component operatively connected to a first terminal and a second terminal of the high-voltage battery using contactors;
reference resistors operatively connected to the first terminal and the second terminal of the high-voltage battery via a respective first switch and a second switch, with a voltage measurement device configured to detect voltage values present between the first terminal and the second terminal and a reference potential of the vehicle;
a controller operatively connected to the first switch and the second switch and the voltage measurement device and configured to detect the voltage values present between the first terminal and the second terminal and the reference potential of the vehicle; and
a coupling circuit configured to monitor the high-voltage component when the contactors are open, the coupling circuit having a third switch and at least one coupling resistor connected directly to the first terminal of the high-voltage battery via the third switch,
wherein the insulation resistance of the high-voltage battery is measured by alternately switching the reference resistors to the first terminal and the second terminal, and the insulation resistance of the high-voltage component is measured by coupling the high-voltage component to the high-voltage battery.

2. The device of claim 1, wherein the controller is configured to detect the voltage values depending on switching states of the first switch and the second switch.

3. The device of claim 2, wherein the controller is operatively connected to the first switch and the second switch.

4. The device of claim 3, wherein the controller is configured to detect the voltage values depending on the switching states of the first switch and the second switch.

5. The device of claim 1, wherein the reference potential is a body of the motor vehicle.

6. A device for detecting insulation resistance of a battery system that includes a high-voltage battery, the device comprising:
a high-voltage component operatively connected to a first terminal and a second terminal of the battery using switchable contactors;
reference resistors operatively connected to the first terminal and the second terminal of the battery via a respective first switch and a second switch, with a voltage measurement device configured to detect voltage values present between the first terminal and the second terminal and a reference potential;
a controller operatively connected to the first switch and the second switch and the voltage measurement device and configured to detect the voltage values present between the first terminal and the second terminal and the reference potential; and a coupling circuit configured to monitor the component when the switchable contactors are open, the coupling circuit having a third switch and at least one coupling resistor connected directly to the first terminal of the high-voltage battery via the third switch, and wherein the insulation resistance of the high-voltage battery is measured by alternately switching the reference resistors to the first terminal and the second terminal, and the insulation resistance of the high-voltage component is measured by coupling the high-voltage component to the high-voltage battery.

7. The device of claim 6, wherein the high-voltage battery is connected to the high-voltage component via switchable contactors.

8. The device of claim 6, wherein the battery system comprises a high-voltage battery system.

9. The device of claim 8, wherein the high-voltage battery system is for a motor vehicle.

10. The device of claim 9, wherein the reference potential is at a body of the motor vehicle.

11. The device of claim 6, wherein the controller is configured to detect the voltage values depending on a state of the first switch and a state of the second switch.

12. The device of claim 11, wherein the controller is operatively connected to the switchable contactors.

13. The device of claim 12, wherein the controller is configured to detect the voltage values depending on switching states of the switchable contactors.

14. A device for detecting insulation resistance of a high voltage battery system of a motor vehicle that includes a high-voltage battery, the device comprising:

a high-voltage component operatively connected to a first terminal and a second terminal of the high-voltage battery via switchable contactors;

reference resistors operatively connected to the first terminal and the second terminal of the high-voltage battery, with a voltage measurement device configured to detect voltage values present between the first terminal and the second terminal and a reference potential of the motor vehicle;

a controller operatively connected to a first switch and a second switch and the voltage measurement device and configured to detect the voltage values present between the first terminal and the second terminal and the reference potential; and a coupling circuit configured to monitor the component when the switchable contactors are open, the coupling circuit having a third switch and at least one coupling resistor connected directly to the first terminal of the high-voltage battery via the third switch, wherein the insulation resistance of the high-voltage battery is measured by alternately switching the reference resistors to the first terminal and the second terminal, and the insulation resistance of the high-voltage component is measured by coupling the high-voltage component to the high-voltage battery.

15. The device of claim 14, wherein the high-voltage battery is connected to the high-voltage component via switchable contactors.

16. The device of claim 14, wherein the controller is operatively connected to the switchable contactors.

17. The device of claim 16, wherein the controller is configured to detect the voltage values depending on switching states of the switchable contactors.

* * * * *